United States Patent
Wu

(10) Patent No.: US 9,605,877 B2
(45) Date of Patent: Mar. 28, 2017

(54) COMPACT PARABOLIC SOLAR CONCENTRATORS AND COOLING AND HEAT EXTRACTION SYSTEM

(76) Inventor: Edward Wu, Agoura Hills, CA (US)

( * ) Notice: Subject to any disclaimer, the term of this patent is extended or adjusted under 35 U.S.C. 154(b) by 444 days.

(21) Appl. No.: 12/703,374

(22) Filed: Feb. 10, 2010

(65) Prior Publication Data

US 2011/0192440 A1    Aug. 11, 2011

(51) Int. Cl.
| | |
|---|---|
| H01L 31/052 | (2014.01) |
| H01L 31/054 | (2014.01) |
| H02S 40/42 | (2014.01) |
| H02S 40/44 | (2014.01) |
| F24J 2/14 | (2006.01) |
| F24J 2/50 | (2006.01) |
| F24J 2/10 | (2006.01) |

(52) U.S. Cl.
CPC . *F24J 2/14* (2013.01); *F24J 2/50* (2013.01); *H01L 31/0521* (2013.01); *H01L 31/0547* (2014.12); *H02S 40/425* (2014.12); *H02S 40/44* (2014.12); *F24J 2002/1061* (2013.01); *Y02E 10/45* (2013.01); *Y02E 10/52* (2013.01); *Y02E 10/60* (2013.01); *Y10T 29/49355* (2015.01)

(58) Field of Classification Search
USPC .................................. 136/243–265
See application file for complete search history.

(56) References Cited

U.S. PATENT DOCUMENTS

| | | | | |
|---|---|---|---|---|
| 4,177,083 A | * | 12/1979 | Kennedy | 136/259 |
| 4,604,494 A | * | 8/1986 | Shepard, Jr. | 136/246 |
| 6,244,062 B1 | * | 6/2001 | Prado | 62/235.1 |
| 2003/0075212 A1 | * | 4/2003 | Chen | 136/246 |
| 2006/0243319 A1 | * | 11/2006 | Kusek et al. | 136/246 |
| 2006/0266408 A1 | * | 11/2006 | Horne et al. | 136/246 |
| 2008/0000516 A1 | * | 1/2008 | Shifman | 136/246 |
| 2008/0185034 A1 | * | 8/2008 | Corio | 136/246 |
| 2008/0251113 A1 | * | 10/2008 | Horne et al. | 136/246 |
| 2008/0264468 A1 | * | 10/2008 | Young et al. | 136/246 |

(Continued)

FOREIGN PATENT DOCUMENTS

| | | |
|---|---|---|
| WO | WO 2008143482 A2 | * 11/2008 |
| WO | WO 2009152343 A1 | * 12/2009 |

OTHER PUBLICATIONS

"Parabolic antennas," [retrieved from internet at http://www.montgomerycollege.edu/Departments/cadtecgt/es100c/materials/Bern/parabolic%20antennas.pdf on Apr. 23, 2013].*

(Continued)

*Primary Examiner* — Eric R Smith
(74) *Attorney, Agent, or Firm* — S McPherson IP Law

(57) ABSTRACT

The present invention discloses a compact solar concentrator module and array preferably with cooling and heat extraction system for converting solar energy to other energy forms preferably electric and thermal energies. The solar concentrator module comprises a vacant structure with a substantially reflective parabolic inside surface, as well as a focal device disposed within the vacant structure for receiving a solar energy converter or a solar cell preferably photovoltaic cell. the focal device being positioned proximate to the focal point of the reflective parabolic inside surface, and a transparent cover coupled to the vacant structure opposing to the reflective parabolic inside surface for transmitting sunlight therein.

52 Claims, 6 Drawing Sheets

(56) References Cited

U.S. PATENT DOCUMENTS

| | | | |
|---|---|---|---|
| 2009/0056790 A1* | 3/2009 | Tian | F24J 2/06 |
| | | | 136/246 |
| 2009/0145474 A1* | 6/2009 | Pang | H01L 31/0547 |
| | | | 136/248 |
| 2009/0159115 A1* | 6/2009 | Banin et al. | 136/248 |
| 2009/0159126 A1* | 6/2009 | Chan | H01L 31/0547 |
| | | | 136/259 |
| 2009/0183762 A1* | 7/2009 | Jackson et al. | 136/246 |
| 2010/0012169 A1* | 1/2010 | Jensen | H01L 31/0547 |
| | | | 136/246 |
| 2011/0120539 A1* | 5/2011 | Minano et al. | 136/255 |

OTHER PUBLICATIONS

"Thick film," published by Sefar [retrieved from internet at http://www.sefar.us/htm/609/en/-Thick-Film.pdf?Folder=3171241 on Apr. 23, 2013].*

A. Plesniak, et al., "High performance concentrating photovoltaic module designs for utility scale power generation", 2009 34th IEEE PV Specialists Conference (PVSC) (Jun. 7-12, 2009).*

Definition of coupled [retrieved from internet at http://www.thefreedictionary.com/coupled on Jul. 31, 2014].*

* cited by examiner

COMPACT PARABOLIC SOLAR CONCENTRATORS AND COOLING AND HEAT EXTRACTION SYSTEM

BACKGROUND OF THE INVENTION

The present invention relates to collection and conversion of solar energy to other energy forms such as electric and thermal energies.

The rapidly dwindling petroleum-based sources of energy have increased focus on more renewable and sustainable alternative sources of energy. Among those alternatives, solar power stands out for its practically infinite supply, practically no Green House pollution, and easy access. A variety of prior art products and systems have been developed to collect and utilize solar energy. However, such products and systems suffer from many disadvantages such as complex and large size structures, great initial cost, central point of failure, and high susceptibility to operational damage.

One example is BrightSource Energy's Luz Power Tower (LPT) 550 energy system. This system requires a large area for housing thousands of mirrors, each of which track the sun and reflect sunlight to a central boiler located on a high tower. Superheated stream from the boiler is delivered to a standard turbine where electricity is generated. Due to its large scale requirement and forbiddingly high cost, this technology lacks flexibility to apply to individual homes or businesses. As a result of receiving radiation reflected from the thousands of mirrors, the boiler is often overheated and thus wears out fast exposing the entire deployment to a major problem of central point of failure. The overall efficiency of the solar farm is hence reduced considerably. Moreover, frequent and costly maintenance efforts are required for the thousands of mirrors as they are directly exposed to the outside environment.

Another conventional approach is represented by Solel's UVAC 2008 solar receiver. This system operates via a gigantic parabolic trough that collects heat from the sun. A solar field for such system is typically located in a desert or other remote areas. Accordingly transmission of power generated by this system is burdensome and costly. Additionally, Solel's system suffers from the same deficiencies as the LPT system.

Similar to Solel's UVAC system, the ZenithSolar Concentrated Photovoltaic (CPV) system employs a very large disk to gather the solar rays. Myriads of flat mirrors are disposed over the surface of the disk to reflect radiation towards a solar cell. Because the individual mirror needs to be discretely handled, installation and alignment of these mirrors makes this system highly labor intensive. In addition, the interconnection of the numerous system parts requires a high precision level that can only be achieved by compromising efficiency of assembling and maintaining it.

SUMMARY OF THE INVENTION

Given the above deficiencies of the prior art, there exists a need for a solar concentrator, which is compact, modular, cost-effective, efficient in energy conversion, and small enough to avoid the central point of failure problem. The present invention satisfies such a need by providing an all-in-one solar concentrator integrated within a miniature structure, preferably a sealed and protected enclosure.

Advantageously, the stationary positioning of the major parts of the solar module relative to the structure avoids complicated assembling and alignment concerns. Furthermore, the present invention allows the high efficiency photovoltaic cell to operate at a relatively high concentration ratio, resulting in a substantial cost reduction due to the leverage effect caused by the concentrator.

Advantageously, the present invention is far more durable compared to the prior art design in that the closed structure shields internal components from dust, wind, and other natural environmental harms. It also accommodates small dimensions such as 12"×12"×6" for a one solar concentrator embodiment or 12"×12"×0.6" for a 100 solar concentrator embodiment. This invention thus can be placed in a great range of locations with varying climate conditions and space limitations.

According to an embodiment, the present invention comprises a vacant structure having an internal parabolic surface with a layer of reflecting substance disposed thereupon. A focal device is disposed within the structure for receiving a solar energy converter or a solar cell. The focal device is positioned on a focal point of the reflective parabolic inside surface. A transparent cover is advantageously coupled to the vacant structure, opposing the reflective parabolic surface. A solar energy converter or a solar cell (preferably a photovoltaic cell) is mounted onto the focal device to generate electric and thermal energies or other energy forms.

According to an aspect of the present invention, a heat extractor absorbs and conducts radiation heat collected on the solar concentrator module so that thermal energy is generated with electric energy therefrom simultaneously. This heat extractor feature greatly enhances the energy conversion efficiency of the solar cell because of the generated thermal energy added to the electric energy. The heat extractor is also able to keep the solar concentrator module at a lower operation temperature so as to increase the solar or photovoltaic conversion efficiency. Furthermore, the sealed structure that insulates the concentrator interior from outside environment as well as an insulated external heat conduction system can be adapted to reduce heat loss. As a result, the overall thermal energy conversion efficiency of the solar concentrator module is significantly improved.

A wire is connected to the solar cell for forwarding electricity, preferably to a power storage device or distribution system; and an external thermal system is connected to the heat extractor for cooling the solar energy converter and gathering thermal energy.

Advantageously, the present invention can be used in connection with a solar tracking mechanism, which is capable of adjusting the position and orientation of the structure to improve sunlight focus efficiency.

Advantageously, the capacity of the present invention to generate power is easily augmented by constructing multiple reflective parabolic inside surfaces and incorporating solar energy converters and heat extractors into the concentrator module.

These and other features and advantages of this invention will become further apparent from the detailed description and accompanying figures that follow. In the figures and description, numerals indicate the various features of the invention, like numerals referring to like features throughout both the drawings and the description.

Figure 1:
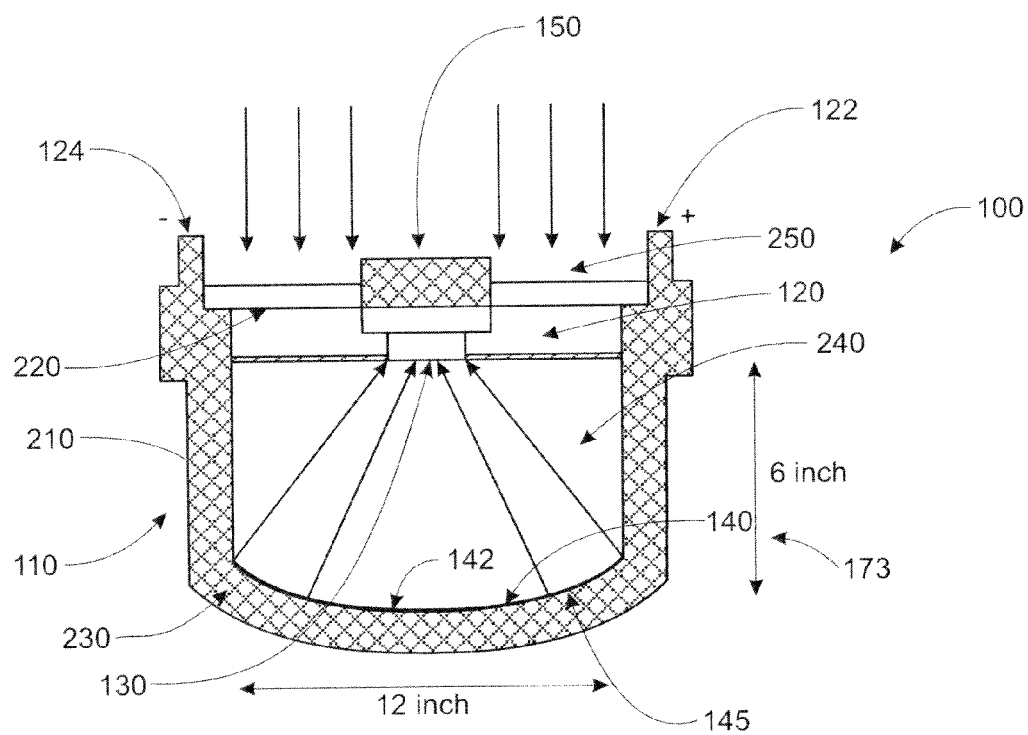
FIG. 1 is a cross-sectional view of an embodiment of a solar concentrator module in accordance with the present invention.

One of ordinary skill in the art would appreciate that the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENT(S)

Figure 2:
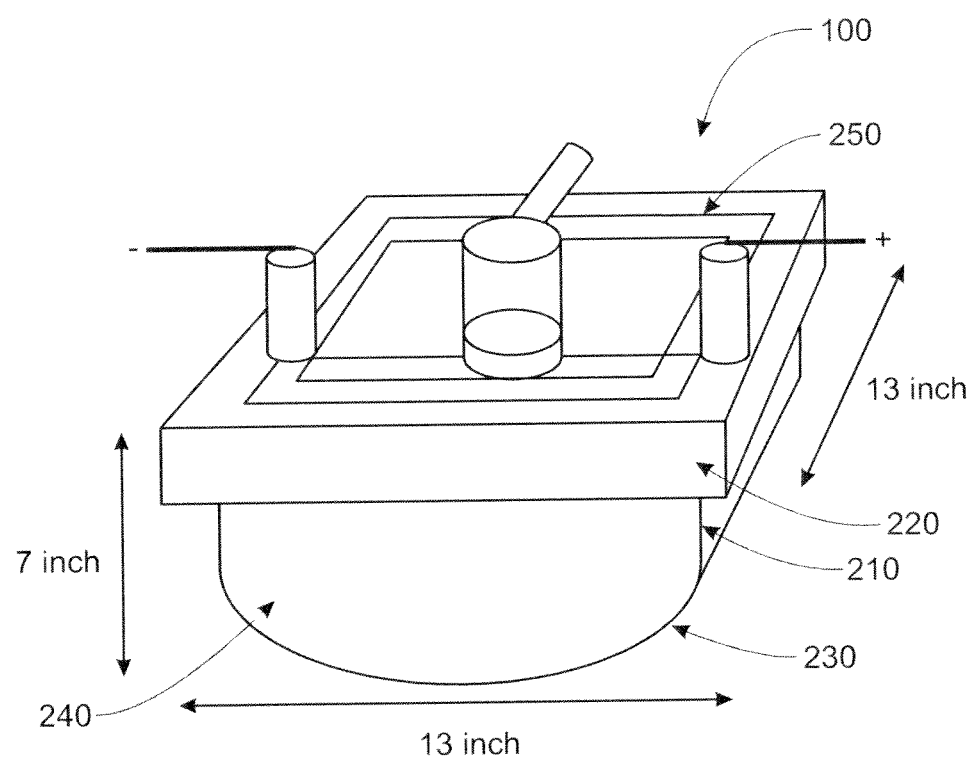
FIG. 2 provides an overhead front view of the solar concentrator module in accordance with the present invention.

FIG. 1 is a cross-sectional view of an embodiment of a solar concentrator module 100 in accordance with the present invention. The module 100 extracts solar energy from the sunrays and converts it to electric and thermal powers. The module 100 includes a vacant structure 110 providing space for transmitting and reflecting the sunrays. The vacant structure 110 is formed with and defined by, e.g., sidewalls 210, ceiling 220 and floor 230 as depicted in FIG. 2, which provides an overhead front view of the module 100. The sidewalls 210, ceiling 220 and floor 230 are preferably formed as integral parts of the vacant structure 110 in a fixed spaced relationship and are preferably sealed together. Thus an air-tight space 240 is created therein so as to insulate it from the outside. Rigid and durable materials such as glass, plastics, metals, ceramics, glass ceramics, composites or the like are preferably used for the vacant structure 110. The vacant structure 110 is preferably enclosed so as to protect internal components, and can be formed in various shapes, such as square, hexagonal, cylindrical frames or boxes. Moreover, the vacant structure 110 can be manufactured by a simplified process, e.g., metal forging, plastic injection molding, glass casting and molding, and the like.

Referring to FIG. 2, a transparent layer 250 can be added or sealed to the ceiling 220, thereby providing a transparent medium for the sunrays to transmit therethrough and subsequently reflect within the vacant structure 110 to concentrate on a focal point. Preferably, the transparent layer 250 is part of the ceiling 220 and positioned in a substantially central area thereof. The transparent layer 250 is made of materials transparent to light, such as glass, plastic or the like.

Referring to FIG. 1, focal device 120 is superimposed on the transparent layer 250. Solar cell 130 (preferably a photovoltaic cell) is disposed upon for extracting electrical energies from the sun beams. The focal device 120 is preferably mounted on the transparent layer 250 and optionally can be supported on a pole or beam of solid metals coupled to the vacant structure 110. A reflective parabolic inside surface 140 is provided on the bottom of the vacant structure 110 to reflect or mirror the sun beams received therein onto the focal point of the reflective parabolic inside surface 140. The reflective parabolic inside surface 140 can be formed monolithically on a substrate 145 or on the floor 230, which is preferably made of plastics, glass, ceramics, metals, composites and other suitable substances.

The focal device 120 is placed at or near the focal point of the reflective parabolic inside surface 140 for receiving a solar cell and to optimize collection of solar energy. The solar cell 130 is comprised of suitable materials which generate electricity when exposed to the sunrays, such as photovoltaic materials including selenium, silicon, GaAs, CdTe, CIGS (copper indium gallium (di)selenide), as well as dye sensitized materials, and other suitable materials.

Solar cell 130 is connected to a positive electrode 122 and a negative electrode 124, which is made of conductive materials, such as metals. The electrodes lead the electricity generated from the solar cell 130 to an electric power storage device such as a battery or the like or an electric power distribution system. Easy plug-in connectors, converters/inverters, and other components may be added in the electric circuit. By way of example, a matching piezoelectric ceramic inverter and lithium battery can be connected to form an electric power generator, which can be either stand-alone or integrated into a greater system.

As the solar concentrator module 100 is expected to keep its optimum energy conversion efficiency and last an extended life time, an optimum operation temperature range needs to be properly maintained. Excessive temperature and heat accumulated tend to degrade the energy conversion efficiency and wear out the solar cell 130. Therefore, a heat extractor 150 is attached to focal device 120 to absorb and transfer heat to, for example, an external heat storage and a water/liquid cooling system. The heat extractor 150 is comprised of highly thermal conductive metals such as copper and aluminum.

In effect, several thermal processes are involved in the solar thermal conversion of the solar concentrator module 100 including heat transmission, reflection, absorption, radiation, conduction, convection and insulation. To maximize the conversion of solar energy to both electric and thermal energies in the solar concentrator module 100, a highest quality is required of: transparency of layer 250, reflection of reflective parabolic inside surface 140, and heat absorption of heat extractor 150. In addition, a preferable air-tight and sealed vacant space 240 can prevent heat loss from vacant space 240 to the outside environment.

Furthermore, a complete solid cooling and heat extraction system based on the heat conduction characteristics of metals is preferably used to optimize the solar thermal energy conversion process without facing the problems of leaking and rusting of the pipelines caused by conventional liquid cooling systems. According to Fourier's Law of Heat Conduction ($Q/A = k \, dT/L$), in which the heat conduction efficiency ($Q/A$) of a metal conductor is reversed proportional to the dimension (L) of the solar concentrator, the optimum size (cross area) of the heat conduit made of copper conductor for a 12"×12"×6" solar concentrator module 100 is about 1 cm$^2$ at operation temperature 150 degree Centigrade.

Generally, the larger the reflective parabolic inside surface 140 of the solar concentrator module 100, the higher amount the incident sunrays and the solar energy can be extracted, thereby generating more electric and thermal energies. Meanwhile, high temperature imposed on the solar cell 130 will degrade the solar energy conversion efficiency and speed wearing out the concentrator module 100 and its components. To address this issue, a cooling and heat extraction system is provided to generate more electric and thermal energies as well as maintain the solar cell 130 at a relatively low operation temperature.

Figure 6A:
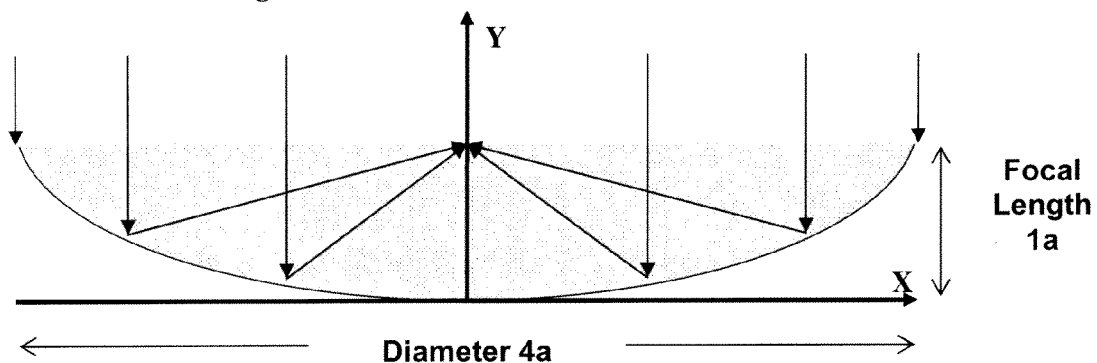
FIGS. 6a and 6b illustrate focal length and diameter proportions in accordance with an embodiment of the invention.
Figure 6B:
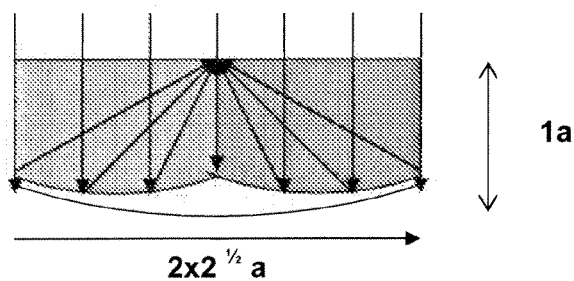

The dimensions as exemplified in the solar concentrator module 100 are 13"×13"×7" in its exterior and 12"×12"×6" in its interior. Specifically, the focal length 173 is 6" between the lowest point 142 of the reflective parabolic inside surface 140 and the solar cell 130, for instance. The diameter of the reflective parabolic inside surface 140 is 24". One of ordinary skill in the art would appreciate that the focal length 173 and the diameter can be varied based on the formulas and concepts illustrated in FIGS. 6a and 6b.

Figure 3A:
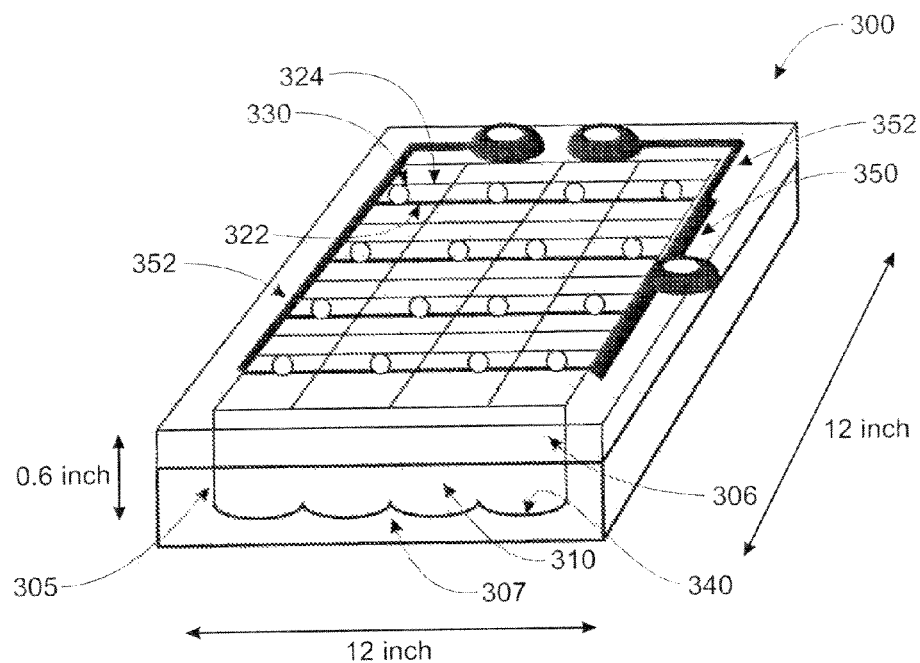
FIG. 3a is a perspective view of a solar concentrator module with multiple reflective parabolic inside surfaces and solar cells integrated therein.
Figure 3B:
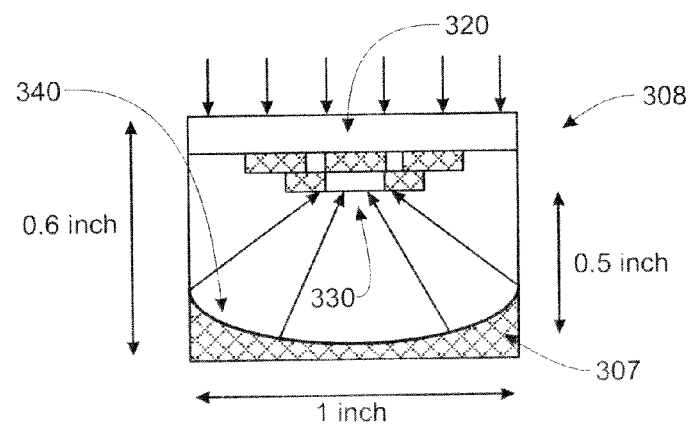
FIG. 3b is a cross-sectional view of an embodiment of a sub-module in accordance with the present invention.

FIG. 3a is a perspective view of another embodiment of the solar concentrator module 300, where multiple reflective parabolic inside surfaces 340 and solar cells 330 (preferably photovoltaic cells) are integrated in. The solar concentrator module 300 of this embodiment comprises a plurality of sub-modules 308 (as shown in FIG. 3b) substantially identical to the module 100, with differing dimensions.

In reference to FIG. 3a, a vacant structure 310 is defined by sidewalls 305, ceiling 306 and floor 307 as is implemented in FIG. 2. Within the vacant structure 310 are formed a matrix of reflective parabolic inside surfaces 340. At or proximate to each focal point of the reflective parabolic inside surfaces 340 is disposed a focal device 320 which holds a solar cell 330 to convert energies. The focal device 320 is attached to the ceiling 306, and is optionally supported by a pole or beam mounted on the parabolic inside surfaces or the vacant structure 310, for example.

Similar to the embodiment illustrated in FIGS. 1 and 2, the solar cell 330 (preferably photovoltaic cell) is connected to a positive electrode 322 and a negative electrode 324 for each sub-module 308 to transfer the electricity from the solar cell 330 to a power storage device such as battery, or power distribution system. The positive electrodes 322 are connected with one another through cables 352 organized in rows; so are the negative electrodes 324. Heat extractors 350 are attached to the focal devices 320 respectively to absorb, conduct and direct heat to heat conduit and heat storage.

In the solar concentrator module 300, preferably all electric components, including positive electrodes 322, negative electrodes 324 and cables 352, as well as all thermal components such as heat extractors 350 are manufactured by either thin film or thick film technologies.

The exemplary dimensions of the solar concentrator module 300 in FIG. 3a are 12"×12"×0.6" in its exterior. The module 300 may contain, e.g., one hundred 1"×1"×0.5" sub-modules 308 organized in a matrix, for example. One main advantage of the solar concentrator module 300 over the solar concentrator 100 is the thinner appearance and higher heat conduction efficiency inherent from the miniature size of sub-modules 308.

Figure 4:
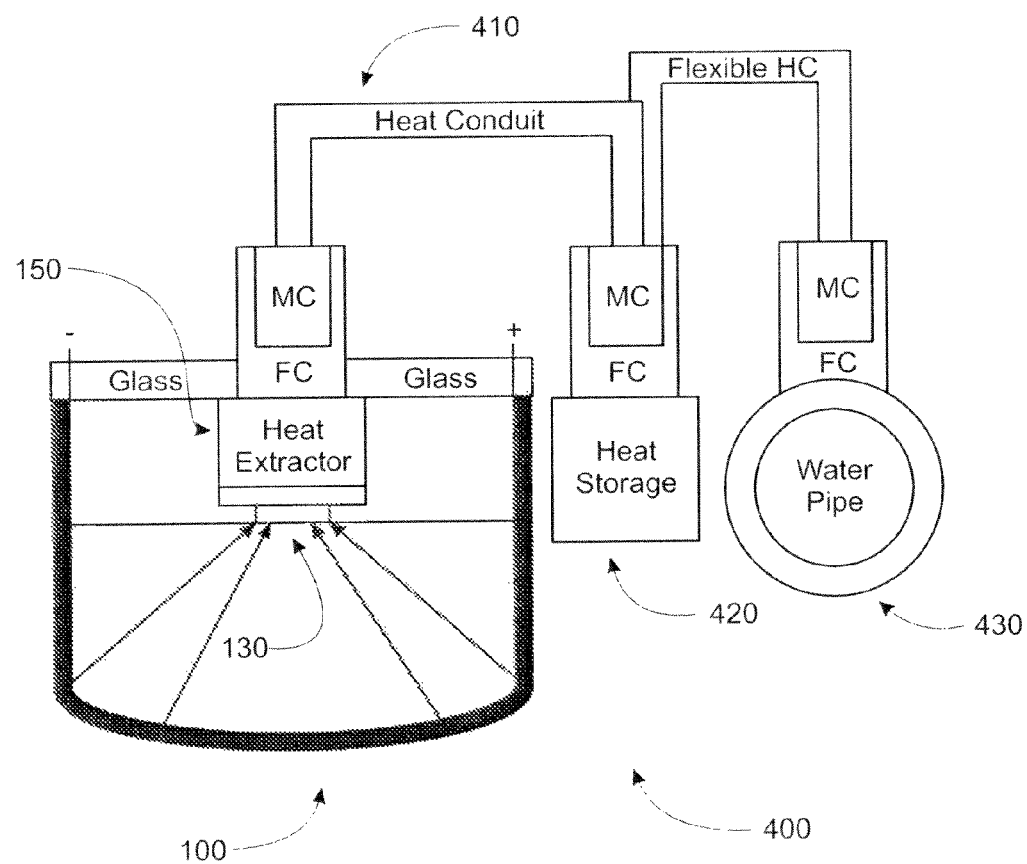
FIG. 4 is a diagram of a cooling and heat extraction system for the solar concentrator module according to the present invention.

FIG. 4 depicts a diagram of a cooling and heat extraction system 400 employed in connection with the solar concentrator module 100. The heat extractor 150 is connected to a heat conduit 410, through which heat is transmitted to heat storage 420. While the heat conduit 410 and heat storage 420 are preferably made of solid metals such as copper or aluminum, the heat conduit 410 and heat storage 420 in various embodiments consist of both outbound and inbound paths circulating water or cooling liquid to pass heat from the solar concentrator module 100 to the heat conduit 410 and heat storage 420.

In addition, the heat storage 420 is connected to a water/liquid pipe 430 so that water, for example, can be used as the cooling liquid which can either carry heat outbound from the heat storage 420 by heat exchange or directly circulate in the heat conduit 410 and heat storage 420. The heat exchange and liquid (water for example) circulation not only reuses the heat built up with time but also reduces the overheating of the solar cell 130. The external cooling and heat extraction system including the heat conduit 410, the heat storage 420 and the water/liquid pipe 430 are preferably insulated from the outside environment to prevent heat loss when transporting heat.

Figure 5:
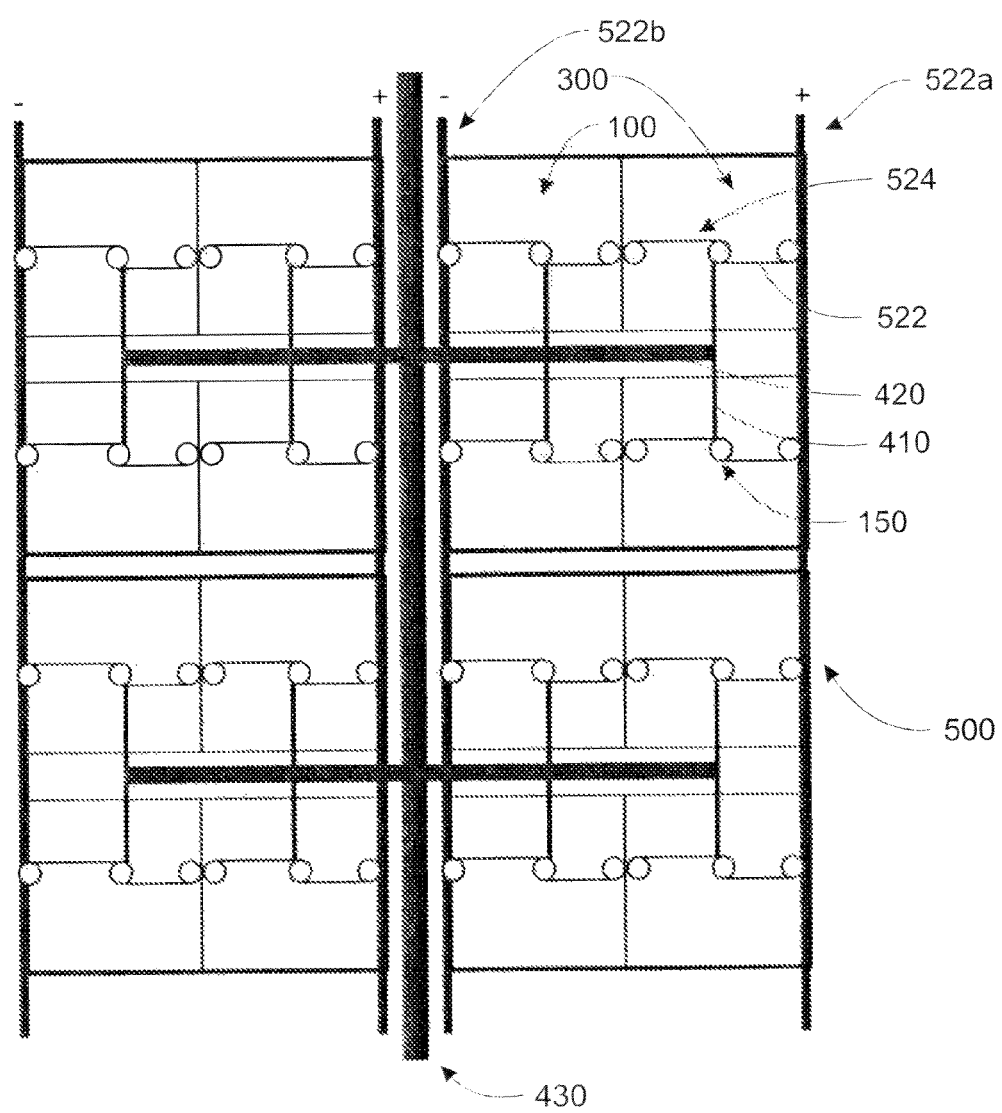
FIG. 5 provides a diagram of the solar concentrator array with multiple modules connected with a plurality of electrodes and cables arranged between neighboring rows and modules.

FIG. 5 depicts a diagram showing how the heat conduit and electrodes are aligned in the solar concentrator array 500 with multiple modules 100 (see also FIG. 1) or 300 (see also FIG. 3a). As set forth above, the positive electrodes 522 are connected with one another through the cable 522a. Similarly, the negative electrodes 524 are connected together via the cable 522b. The cables 522a and 522b are respectively aligned between rows of modules 100 (see also FIG. 1) or 300 (see also FIG. 3a), and both of them are ultimately connected to the power storage device or power distribution system.

In FIG. 5, the heat extractors 150 are each attached to the heat conduit 410 which is connected to the heat storage 420. Both of the heat conduit 410 and the heat storage 420 are distributed between rows of modules 100 (see also FIG. 1) or 300 (see also FIG. 3a) and ultimately lead to the water/liquid pipe 430. The cables 522a, 522b, heat conduit 410 and heat storage 420 are aligned in parallel and insulated so as to avoid contacting each other and prevent electric, heat, or magnetic interferences.

A solar tracker is provided to ensure the highest efficiency and effectiveness of the present invention. The solar tracker adjusts orientation of the solar concentrator modules 100 and 300 as well as the solar concentrator array 500 towards the sun to follow its motion by hours and seasons. Various types of solar trackers may be used, among which, single- and two-axis trackers are well known and commonly utilized.

Preferably, a remote (wire or wireless) control and management system is added to improve administering and maintaining of the solar energy concentrator. With that system, the administration and maintenance personnel can receive continuous data including electric current and voltage, or the operation condition of the tracking system, thereby closely monitoring the performance and minimizing the down time. This remote control and management system preferably performs various control and administration functions necessary for ongoing proper operations.

Having now described the invention in accordance with the requirements of the patent statutes, those skilled in this art will understand how to make changes and modifications in the present invention to meet their specific requirements or conditions. Such changes and modifications may be made without departing from the scope and spirit of the invention as set forth in the following claims.

What is claimed is:

1. A solar concentrator module for collecting and converting solar energy to other energy forms, comprising:
   a vacant structure having a ceiling, floor, and a plurality of vertical sidewalls with a reflective parabolic surface formed on the floor; wherein the reflective parabolic surface has lateral edges which form a square when viewed in plan view, such that the reflective parabolic surface is capable of reflecting incident light to a focal point located laterally in the approximate center of the square; wherein the vertical sidewalls extend from a perimeter of the floor to a height approximately equal to a focal length of the reflective parabolic surface;

the ceiling being supported by the vertical sidewalls proximate to an upper edge of the vertical sidewalls without contacting the reflective parabolic surface;

a transparent layer forming a part of the ceiling of the vacant structure opposite the reflective parabolic surface for transmitting sunlight therein;

a focal device mounted within the vacant structure and supported by the ceiling only such that the focal device is positioned proximate to the focal point of the reflective parabolic surface;

a solar energy converter coupled to the focal device, wherein the solar energy converter includes a solar cell positioned to receive sunlight reflected towards the focal point by the reflective parabolic surface; a heat extractor coupled to the focal device and ceiling, wherein the heat extractor absorbs heat and is connected with a heat conduit, the heat conduit transferring heat outbound to a heat storage and water/liquid pipe; and wherein the vacant structure, ceiling, transparent layer, focal device, vertical sidewalls, reflective parabolic surface and floor are integrally formed in a fixed spaced relationship having stationary positioning such that coupling the solar energy converter to the focal device causes the solar cell to be optically aligned to the reflective parabolic surface.

2. The module of claim 1, wherein the transparent layer in conjunction with the ceiling, floor, and plurality of vertical sidewalls form an air-tight space within the vacant structure to insulate and seal an interior of the vacant structure from an outside environment.

3. The module of claim 1, wherein the vacant structure is manufactured by one of the following processes:
   metal casting;
   metal forging;
   plastic injection molding;
   glass blowing; and
   glass molding.

4. The module of claim 1, wherein the interior height of the vacant structure is 6" and the interior diameter of the parabolic surface is 24".

5. The module of claim 1, wherein the ceiling is flat.

6. The module of claim 1, wherein a layer of reflecting substance is disposed over the parabolic surface.

7. The module of claim 1, wherein the solar cell includes one of the following:
   a photovoltaic cell; and
   a dye-sensitized solar cell.

8. The module of claim 1, further comprising:
   a cable set connected to the solar energy converter for forwarding electricity to an external power storage device.

9. The module of claim 1, wherein the heat conduit is made of one of the following:
   a solid metal; and
   a pipeline for carrying liquid.

10. The module of claim 1, further comprising:
   a solar tracking mechanism attached to the solar concentrator module, the tracking mechanism being capable of adjusting the orientation of the solar concentrator module to improve sunlight exposure.

11. The module of claim 1, further comprising:
   a remote control and management system for constantly receiving data from the module to monitor and control operations thereof.

12. The module of claim 1, wherein the heat extractor is in thermal contact with the solar cell for maintaining a temperature of the solar cell within an optimum operation temperature range.

13. An array of a plurality of solar concentrator modules of claim 1 comprising: multiple rows, each row comprising multiple solar concentrator modules of the plurality of solar concentrator modules, wherein each row is connected in parallel to common negative and positive power cables such that any of the modules in a respective row may be replaced at any time while the modules in other rows continue to generate power.

14. The module of claim 1, further comprising:
   a plurality of reflective parabolic inside surfaces; wherein each of the plurality of reflective parabolic inside surfaces has edges which form a square when viewed in plan view, such that each reflective parabolic surface is capable of reflecting incident light to a focal point located laterally in the approximate center of the square; and
   a plurality of focal devices mounted within the vacant structure and supported by the ceiling for receiving a solar energy converter, each being approximately centered on the corresponding ceiling and positioned proximate to the focal point of the corresponding reflective parabolic surface.

15. The module of claim 14, wherein the interior height of the vacant structure is 0.5" and the interior diameter of the parabolic surfaces is 2".

16. The module of claim 14, wherein the reflective parabolic surfaces are made of a substance which reflects light.

17. The module of claim 14, wherein a layer of reflecting substance is disposed over the parabolic inside surfaces.

18. The module of claim 14, further comprising a plurality of solar energy converters mounted onto the focal devices respectively.

19. The module of claim 18, wherein the solar energy converters include solar cells.

20. The module of claim 19, wherein the solar cells include one of the following:
   a photovoltaic cell; and
   a dye-sensitized solar cell.

21. The module of claim 18, further comprising:
   cable sets connected to the solar energy converters for forwarding electricity to an external power storage device.

22. The module of claim 14, further comprising:
   a plurality of heat extractors coupled to the respective focal devices, wherein the heat extractors are connected with each other through the heat conduit transferring heat outbound.

23. The module of claim 22, wherein the heat conduit is made of one of the following:
   a solid metal; and
   a pipeline for carrying liquid.

24. The module of claim 22, wherein the plurality of heat extractors and the heat conduit are manufactured by one of the following technologies:
   thin film; and
   thick film.

25. The module of claim 14, further comprising:
a solar tracking mechanism attached to the solar concentrator module, the tracking mechanism being capable of adjusting the orientation of the solar concentrator module to improve sunlight exposure.

26. The module of claim 14, further comprising:
a remote control and management system for constantly receiving data from the module to monitor and control operations thereof.

27. A method for collecting and converting solar energy to other energy forms, comprising:
providing a vacant structure having a flat ceiling, floor, and a plurality of vertical sidewalls with a reflective parabolic surface formed on the floor; wherein the reflective parabolic surface has lateral edges which form a square when viewed in plan view, such that the reflective parabolic surface reflects incident light to a focal point located laterally in the approximate center of the square; wherein the vertical sidewalls extend from a perimeter of the floor to a height approximately equal to a focal length of the reflective parabolic surface;
supporting the flat ceiling by the vertical sidewalls proximate to an upper edge of the vertical sidewalls without contacting the reflective parabolic surface;
making a transparent layer as a part of the flat ceiling of the vacant structure opposite the reflective parabolic surface for transmitting sunlight therein;
mounting a focal device within the vacant structure and supported by the ceiling only that the focal device is positioned proximate to the focal point of the reflective parabolic surface;
coupling a solar energy converter to the focal device, wherein the solar energy converter includes a solar cell positioned to receive sunlight reflected towards the focal point by the reflective parabolic surface; coupling a heat extractor to the focal device and ceiling, wherein the heat extractor absorbs heat and is connected with a heat conduit, the heat conduit transferring heat outbound to a heat storage and water/liquid pipe; and
integrally forming the vacant structure, transparent layer, focal device, vertical sidewalls, reflective parabolic surface and floor in a fixed spaced relationship having stationary positioning such that coupling the solar energy converter to the focal device causes optical alignment of the solar cell to the reflective parabolic surface.

28. The method of claim 27, wherein coupling the transparent layer includes forming an air-tight space in conjunction with the ceiling, floor, and plurality of vertical sidewalls, within the vacant structure to insulate and seal an interior of the vacant structure from an outside environment.

29. The method of claim 27, wherein providing the vacant structure includes manufacturing the vacant structure by one of the following processes:
metal casting;
metal forging;
plastic injection molding;
glass blowing; and
glass molding.

30. The method of claim 27, wherein the interior height of the vacant structure is 6" and the interior diameter of the parabolic surface is 24".

31. The method of claim 27, wherein providing the vacant structure includes fabricating the reflective parabolic surface of a substance which reflects light.

32. The method of claim 27, wherein providing the vacant structure includes disposing a layer of reflecting substance over the parabolic surface.

33. The method of claim 27, wherein the solar cell includes one of the following:
a photovoltaic cell; and
a dye-sensitized solar cell.

34. The method of claim 27 further comprising:
connecting a cable set to the solar energy converter for forwarding electricity to an external power storage device.

35. The method of claim 27, wherein coupling the heat extractor includes fabricating the heat conduit of one of the following:
a solid metal; and
a pipeline for carrying liquid.

36. The method of claim 27 further comprising:
configuring a solar tracking mechanism to be attached to the solar concentrator module, the tracking mechanism being capable of adjusting the orientation of the solar concentrator module to improve sunlight exposure.

37. The method of claim 27 further comprising:
configuring a remote control and management system to constantly receive data from the module to monitor and control operations thereof.

38. The method of claim 27, wherein the heat extractor is in thermal contact with the solar cell for maintaining a temperature of the solar cell within an optimum operation temperature range.

39. The method of claim 27 further comprising:
providing an array of multiple rows of multiple solar concentrator modules, wherein each row is connected in parallel to common negative and positive power cables such that any of the modules of a respective row may be replaced at any time while the modules in other rows continue to generate power.

40. The method of claim 27 further comprising:
providing a plurality of reflective parabolic surfaces; wherein each of the plurality of reflective parabolic inside surfaces has edges which form a square when viewed in plan view, such that each reflective parabolic surface is capable of reflecting incident light to a focal point located laterally in the approximate center of the square; and
mounting a plurality of focal devices within the vacant structure supported by the ceiling for receiving a solar energy converter, each being positioned proximate to the focal point of the corresponding reflective parabolic surface.

41. The method of claim 40, wherein the interior height of the vacant structure is 0.5" and the interior diameter of the parabolic surfaces is 2".

42. The method of claim 40, wherein providing the plurality of reflective parabolic surfaces includes fabricating the reflective parabolic surfaces of a substance which reflects light.

43. The method of claim 40, wherein providing the plurality of reflective parabolic surfaces includes disposing a layer of reflecting substance over the parabolic surfaces.

44. The method of claim 40 further comprising:
mounting a plurality of solar energy converters onto the focal devices respectively.

45. The method of claim 44, wherein the solar energy converters include solar cells.

46. The method of claim 45, wherein the solar cells include one of the following:
a photovoltaic cell; and
a dye-sensitized solar cell.

47. The method of claim 44 further comprising:
connecting cable sets to the solar energy converters for forwarding electricity to an external power storage device.

48. The method of claim 40 further comprising:
coupling a plurality of heat extractors to the respective focal devices, wherein the heat extractors are connected with each other through the heat conduit transferring heat outbound.

49. The method of claim 48, wherein coupling the plurality of heat extractors includes fabricating the heat conduit of one of the following:
a solid metal; and
a pipeline for carrying liquid.

50. The method of claim 48, wherein coupling the plurality of heat extractors includes manufacturing the heat extractors and heat conduit by one of the following technologies:
thin film; and
thick film.

51. The method of claim 40 further comprising:
configuring a solar tracking mechanism to be attached to the solar concentrator module, the tracking mechanism being capable of adjusting the orientation of the solar concentrator module to improve sunlight exposure.

52. The method of claim 40 further comprising:
configuring a remote control and management system to constantly receive data from the module to monitor and control operations thereof.

* * * * *